(12) United States Patent
Kim

(10) Patent No.: US 6,930,943 B2
(45) Date of Patent: Aug. 16, 2005

(54) METHODS, CIRCUITS, AND SYSTEMS FOR REFRESHING MEMORY CELLS IN A MEMORY DEVICE THAT HAVE DIFFERENT REFRESH PERIODS

(75) Inventor: Gyu-hong Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 13 days.

(21) Appl. No.: 10/383,262

(22) Filed: Mar. 7, 2003

(65) Prior Publication Data

US 2003/0169635 A1 Sep. 11, 2003

(30) Foreign Application Priority Data

Mar. 8, 2002 (KR) ........................................ 2002-12562

(51) Int. Cl.[7] .............................................. G11C 7/00
(52) U.S. Cl. .............. 365/222; 365/230.03; 365/230.08
(58) Field of Search ........................... 365/222, 230.03, 365/230.08

(56) References Cited

U.S. PATENT DOCUMENTS 5,867,439 A * 2/1999 Asakura et al. ........ 365/230.03
5,999,472 A * 12/1999 Sakurai ...................... 365/222

* cited by examiner

*Primary Examiner*—Huan Hoang
(74) *Attorney, Agent, or Firm*—Myers Bigel Sibley & Sajovec

(57) ABSTRACT

Memory cells in a memory device are refreshed by selecting a first memory cell having a first refresh period to be refreshed. The first memory cell and a second memory cell having a second refresh period together are refreshed responsive to selecting the first memory cell to be refreshed. A circuit for controlling refreshing of memory cells in a memory devices includes an address register that stores the address of a first memory cell having a first refresh period. A comparison circuit compares an input address with the output of the address register and outputs a control signal indicative of a result of the comparison. An address buffer outputs addresses for refreshing the first memory cell and a second memory cell having a second refresh period together responsive to the control signal indicating a match between the input address and the address of the first memory cell.

23 Claims, 4 Drawing Sheets

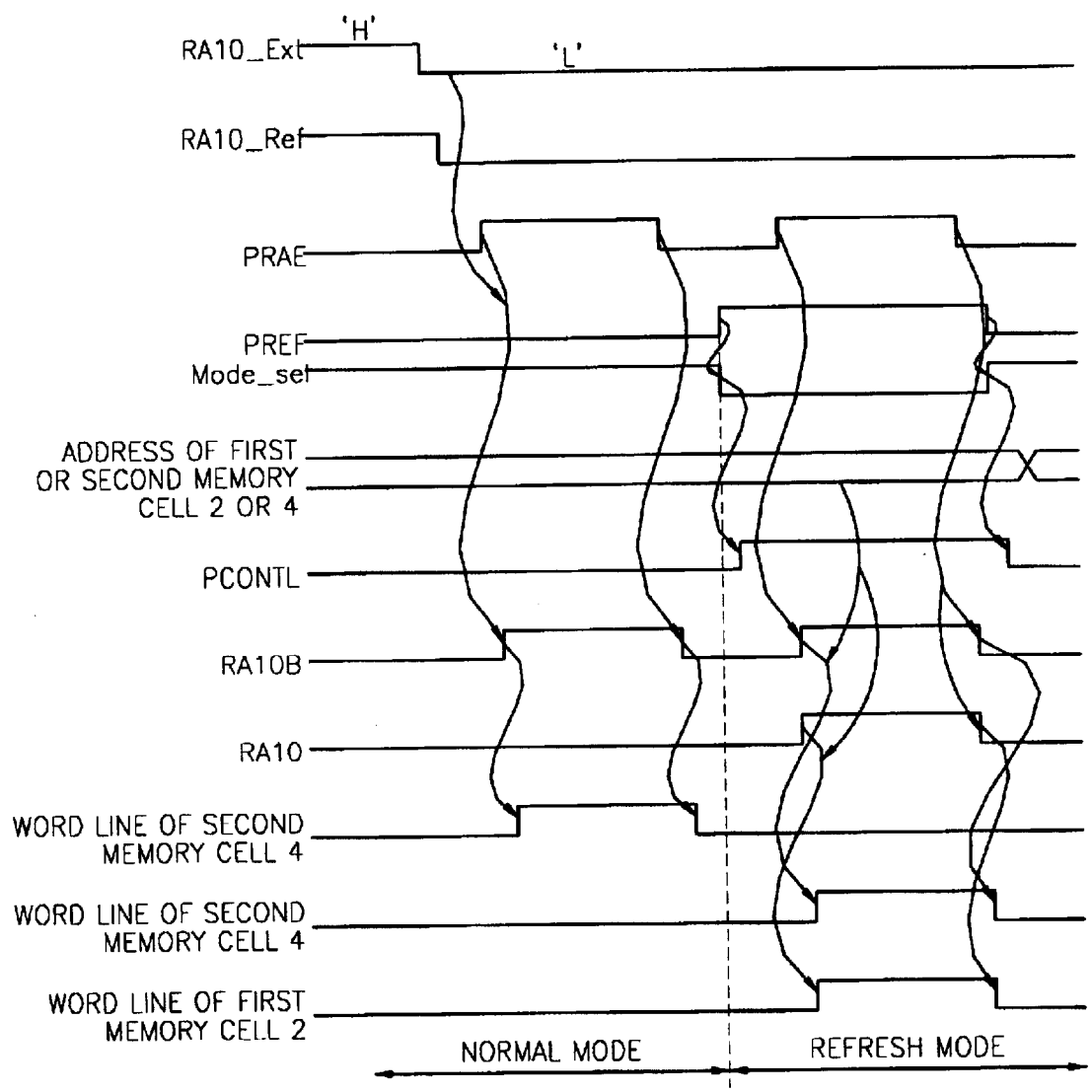

METHODS, CIRCUITS, AND SYSTEMS FOR REFRESHING MEMORY CELLS IN A MEMORY DEVICE THAT HAVE DIFFERENT REFRESH PERIODS

RELATED APPLICATION

This application claims the benefit of Korean Patent Application No. 2002-12562, filed Mar. 8, 2002, the disclosure of which is hereby incorporated herein by reference.

FIELD OF THE INVENTION

The present invention relates generally to integrated circuit devices and methods of operating the same and, more particularly, to integrated circuit memory devices and methods of operating the same.

BACKGROUND OF THE INVENTION

In general, dynamic random access memory (DRAM) memory cells comprise one cell transistor and one cell capacitor. Thus, data (or charge) stored in the cell capacitor is lost by leakage current after a predetermined amount of time passes. Accordingly, data are repeatedly read from and written to the DRAM cell capacitors before the data stored in the cell capacitors are lost. These operations are referred to as refresh operations.

For example, when the refresh period of major memory cells of a DRAM is 64 ms and the refresh period of minor memory cells of the DRAM is 32 ms, the general refresh period of the DRAM may be set to 32 ms or less. This may result in a lower DRAM yield.

In a DRAM comprising 2048 memory cells each having a refresh period of 64 ms, a memory controller outputs a refresh command to a DRAM core every 31.2 $\mu$s. If, however, the refresh period is 32 ms, then the memory controller outputs a refresh command to the DRAM core every 15.6 $\mu$s. Accordingly, if the refresh period of a DRAM is determined on the basis of minor memory cells having a generally shorter refresh period, then the DRAM memory controller outputs refresh commands to the DRAM core at a generally higher frequency. This may increase the load on a bus between the memory controller and the DRAM core and may also increase power consumption in the DRAM.

SUMMARY OF THE INVENTION

According to some embodiments of the present invention, memory cells in a memory device are refreshed by selecting a first memory cell having a first refresh period to be refreshed. The first memory cell and a second memory cell having a second refresh period together are refreshed responsive to selecting the first memory cell to be refreshed.

In other embodiments, the second memory cell to be refreshed is selected and the second memory cell is refreshed responsive to that selection.

In still other embodiments, the second refresh period is shorter than the first refresh period.

In further embodiments, the first memory cell is in a first memory cell array block and the second memory cell is in a second memory cell array block, separate from the first memory cell array block.

Memory cells in a memory device may also be refreshed, according to some embodiments of the present invention, by selecting a first memory cell array block having a first refresh period to be refreshed. The first memory cell array block and a second memory cell array block having a second refresh period are refreshed together responsive to selecting the first memory cell array block to be refreshed.

In other embodiments, the second memory cell array block to be refreshed is selected and the second memory cell array block is refreshed responsive to that selection.

In still other embodiments, the second refresh period is shorter than the first refresh period.

According to some embodiments of the present invention, a circuit for controlling refreshing of memory cells in a memory devices comprises an address register that stores the address of a first memory cell having a first refresh period. A comparison circuit compares an input address with the output of the address register and outputs a control signal indicative of a result of the comparison. An address buffer outputs addresses for refreshing the first memory cell and a second memory cell having a second refresh period together responsive to the control signal indicating a match between the input address and the address of the first memory cell.

In other embodiments, the comparison circuit is responsive to a refresh command signal.

In still other embodiments, the address buffer outputs an address for refreshing the second memory cell responsive to the control signal indicating a non-match between an input address corresponding to the address of the second memory cell and the address of the first memory cell.

BRIEF DESCRIPTION OF THE DRAWINGS

Other features of the present invention will be more readily understood from the following detailed description of specific embodiments thereof when read in conjunction with the accompanying drawings, in which:

FIG. 5 is a timing diagram that illustrates refresh operations in accordance with some embodiments of the present invention.

DETAILED DESCRIPTION OF PREFERRED EMBODIMENTS

Figure 1:
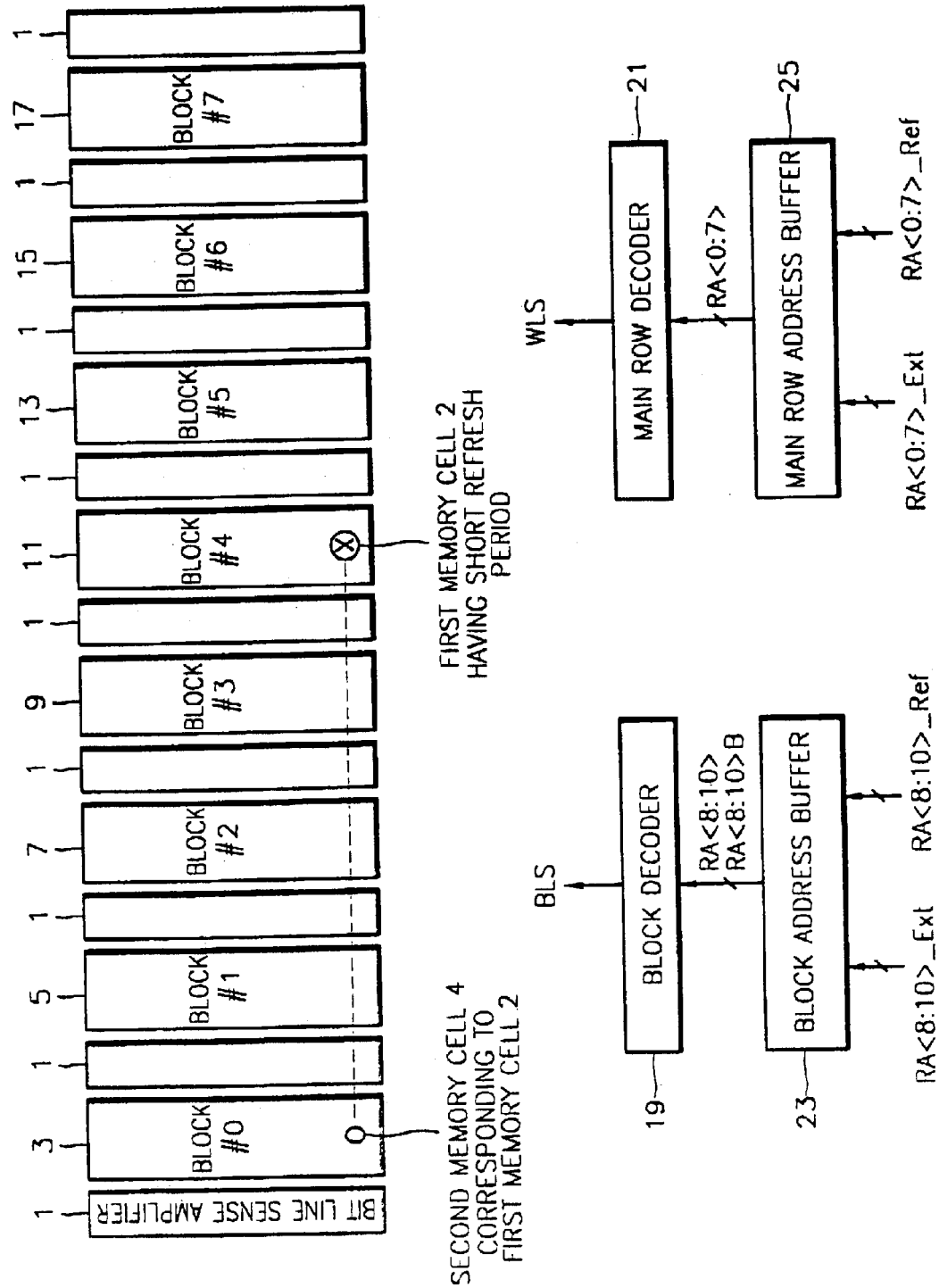
FIG. 1 is a block diagram that illustrates a DRAM core in accordance with some embodiments of the present invention.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. It will also be understood that when an element is referred to as being "connected" or "coupled" to another element, it can be directly connected or coupled to the other element or intervening elements may also be present. In contrast, when an element is referred to as being "directly connected" or "directly coupled" to another element, there are no intervening elements present. As used herein, the recitation "refresh period" corresponds to a time between refresh operations.

Referring now to FIG. 1, a DRAM core, according to some embodiments of the present invention, comprises a plurality of bit line sense amplifiers 1, a plurality of array blocks 3, 5, 7, 9, 11, 13, 15, and 17, a block decoder 19, a main row decoder 21, a block address buffer 23, and a main row address buffer 25. Each of the memory cell array blocks 3, 5, 7, 9, 11, 13, 15, and 17 comprises a plurality of memory cells (not shown), and each of the memory cells comprises one cell transistor and one cell capacitor.

For purposes of illustration, the DRAM core of FIG. 1 comprises eight cell array blocks 3, 5, 7, 9, 11, 13, 15, and 17, and each of the memory cell array blocks comprises 256 memory cells. It will be understood that the present invention is not limited to DRAM cores comprising eight memory cell array blocks. The present invention is applicable to DRAM cores comprising a number N, where N is a natural number, of memory cell array blocks.

The block address buffer 23 buffers the upper 3 bits RA<8:10>_Ext of external addresses or the upper 3 bits RA<8:10>_Ref of refresh addresses and outputs the upper 3 bits RA<8:10> of internal addresses to the block decoder 19. Because the block decoder 19 decodes the upper 3 bits RA<8:10> of internal addresses and outputs a block select signal BLS to the DRAM core, a memory cell array block may be selected from the memory cell array blocks 3, 5, 7, 9, 11, 13, 15, and 17 in response to the upper 3 bits RA<8:10> of an internal address.

When controlling the refresh period for the DRAM core memory cells, block #0 (3) may be selected by setting the refresh address RA<8:10>_Ref to 000 so that the internal address signals RA8B, RA9B, and RA10B are enabled. Block #1 (5) maybe selected by setting the refresh address RA<8:10>_Ref to 001 so that the internal address signals RA8, RA9B, and RA10B are enabled. Block #2 (7) may be selected by setting the refresh address RA<8:10>_Ref to 010 so that the internal address signals RA8B, RA9, and RA10B are enabled. Block #3 (9) may be selected by setting the refresh address RA<8:10> Ref to 011 so that the internal address signals RA8, RA9, and RA10B are enabled. Block #4 (11) maybe selected by setting the refresh address RA<8:10>_Ref to 100 so that the internal address signals RA8B, RA9B, and RA10 are enabled. Similarly, when the refresh addresses RA<8:10>_Ref are set to 101, 110, and 111, block #5 (13), block #6 (15), and block #7 (17) may be selected, respectively.

The main row decoder buffer 25 buffers the lower 8 bits RA<0:7>_Ext of external addresses or the lower 8 bits RA<0:7>_Ref of refresh addresses and outputs 8 bits RA<0:7> of internal addresses to the main row decoder 21. Because the main row decoder 21 decodes the lower 8 bits RA<0:7> of the internal addresses and outputs a word line select signal WLS to the DRAM core, a word line of each memory cell (not shown) in each memory cell array block may be selected in response to the word line select signal WLS.

Block #4 (11) comprises a first memory cell 2 having a first refresh period of, for example, 32 ms. Block #0 (3) comprises a second memory cell 4 having a second refresh period of, for example, 64 ms. The lower 8 bits RA<0:7> used to select the second memory cell 4 of block #0 (3) are the same as the lower 8 bits RA<0:7> used to select the first memory cell 2 of block #4 (11). The upper 3 bits RA<8:10> of the internal address used to select the second memory cell 4 of block #0 (3), however, are <000> and the upper 3 bits RA<8:10> of the internal address used to select the first memory cell 2 of block #4 (11) are <100>. Advantageously, the present invention may provide method and circuit embodiments for refreshing the first memory cell 2, which has a refresh period of 32 ms when the refresh period for the DRAM core is 64 ms.

Figure 2:
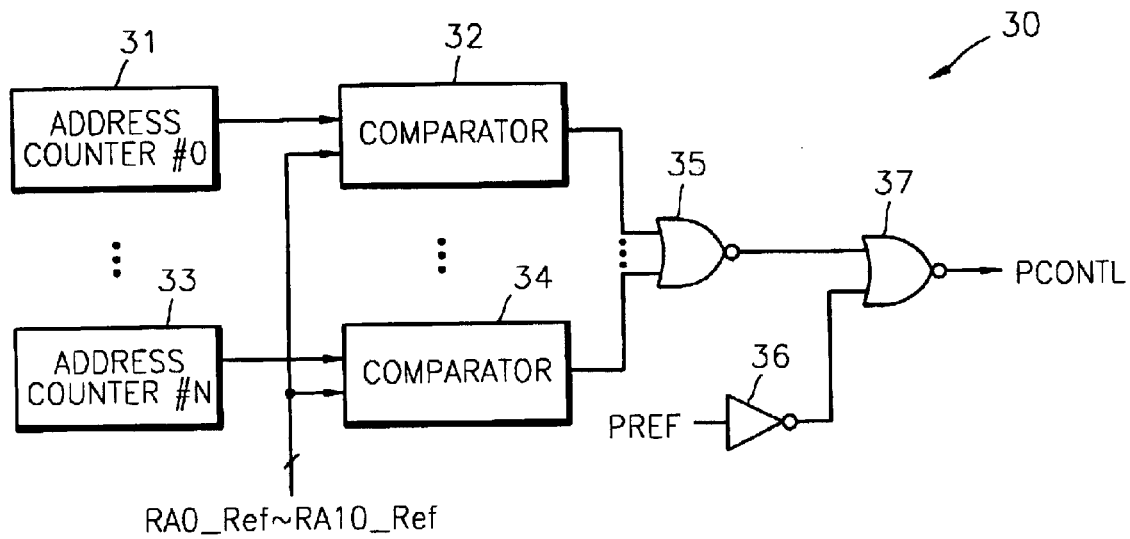
FIG. 2 is a block diagram that illustrates a refresh period control signal generator in accordance with some embodiments of the present invention.

FIG. 2 is a block diagram that illustrates a refresh period control signal generator in accordance with some embodiments of the present invention. The refresh period control signal generator 30 comprises a plurality of address registers 31, . . . , 33, a plurality of comparators 32, . . . , 34, a first logic circuit 35, a second logic circuit 36, and a third logic circuit 37. The plurality of address registers 31, . . . , 33 store the lower 8 bits RA<0:7> of the internal address of the first memory cell 2 of block #4 (11) and the upper 3 bits RA<8:10> of the internal address of the block #0 (3). In other words, the plurality of address registers 31, . . . , 33 store addresses corresponding to the address of the second memory cell 4 of block #0 (3).

The address registers 31, . . . , 33 output the stored addresses of the second memory cell 4 to the comparators 32, . . . , 34, respectively. One address register (e.g., 31) and one corresponding comparator (e.g., 32) constitute one set. Thus, the number of address registers is preferably the same as the number of comparators. Each of the comparators 32, . . . , 34 does a bitwise comparison of the output signals of one of the address registers 31, . . . , 33 with input refresh addresses RA0_Ref~RA10 _Ref and outputs the result of the comparison to the first logic circuit 35. For example, when the refresh addresses RA0_Ref~RA10_Ref are the same as the address of the second memory cell 4 stored in the address registers 31, . . . , 33, then the output signals from the comparators 32, . . . , 34 are "high." The output signal form the NOR logic circuit 35 is, therefore, "low." When, however, the refresh addresses RA0_Ref~RA10_Ref are not the same as at least one of the addresses of the second memory cell 4 stored in the address registers 31, . . . , 33, then the NOR logic circuit 35 generates a "high" output signal.

The second logic circuit 36 comprises an inverter and inverts a refresh command signal PREF. The third logic circuit 37 performs a NOR operation of the output signal from the first logic circuit 35 and the output signal from the second logic circuit 36 and generates a refresh period control signal PCONTL as an output signal. The plurality of address registers 31, . . . , 33, the first logic circuit 35, the second logic circuit 36, and the third logic circuit 37 constitute a comparison circuit. That is, the comparison circuit compares the input refresh addresses RA0_Ref~RA10_Ref with outputs of the plurality of address registers 31, . . . , 33 in bitwise fashion in a refresh mode and outputs the refresh period control signal PCONTL corresponding to the result of the comparison.

Figure 3:
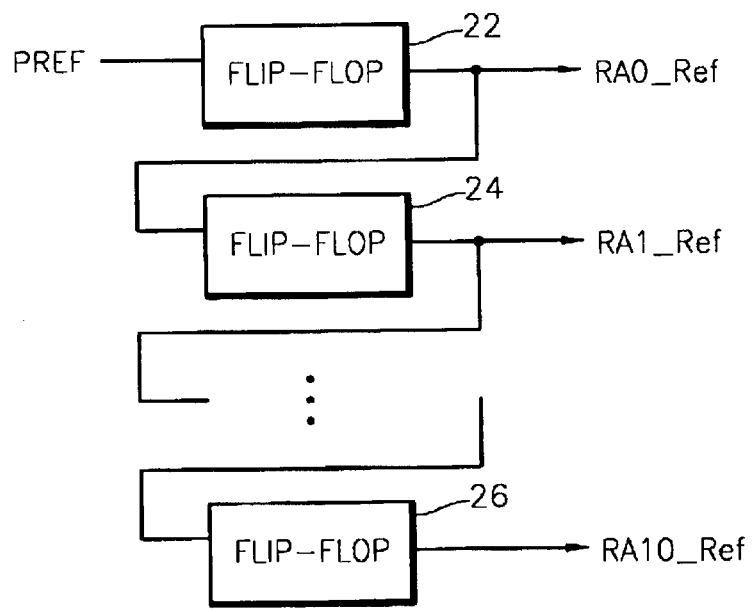
FIG. 3 is a block diagram that illustrates an address counter in accordance with some embodiments of the present invention.

FIG. 3 is a block diagram that illustrates an address counter in accordance with some embodiments of the present invention. A plurality of flip-flops 22, 24, . . . , 26 are connected in series and the refresh addresses RA0_ Ref~RA10_Ref comprise the output signals of the flip-flops 22, 24, . . . , 26. The plurality of flip-flops 22, 24, . . . , 26 are responsive to the refresh command signal PREF and generate the refresh addresses RA0_Ref~RA10_Ref, which are provided to each of the comparators 32, . . . , 34 shown in FIG. 2.

Figure 4:
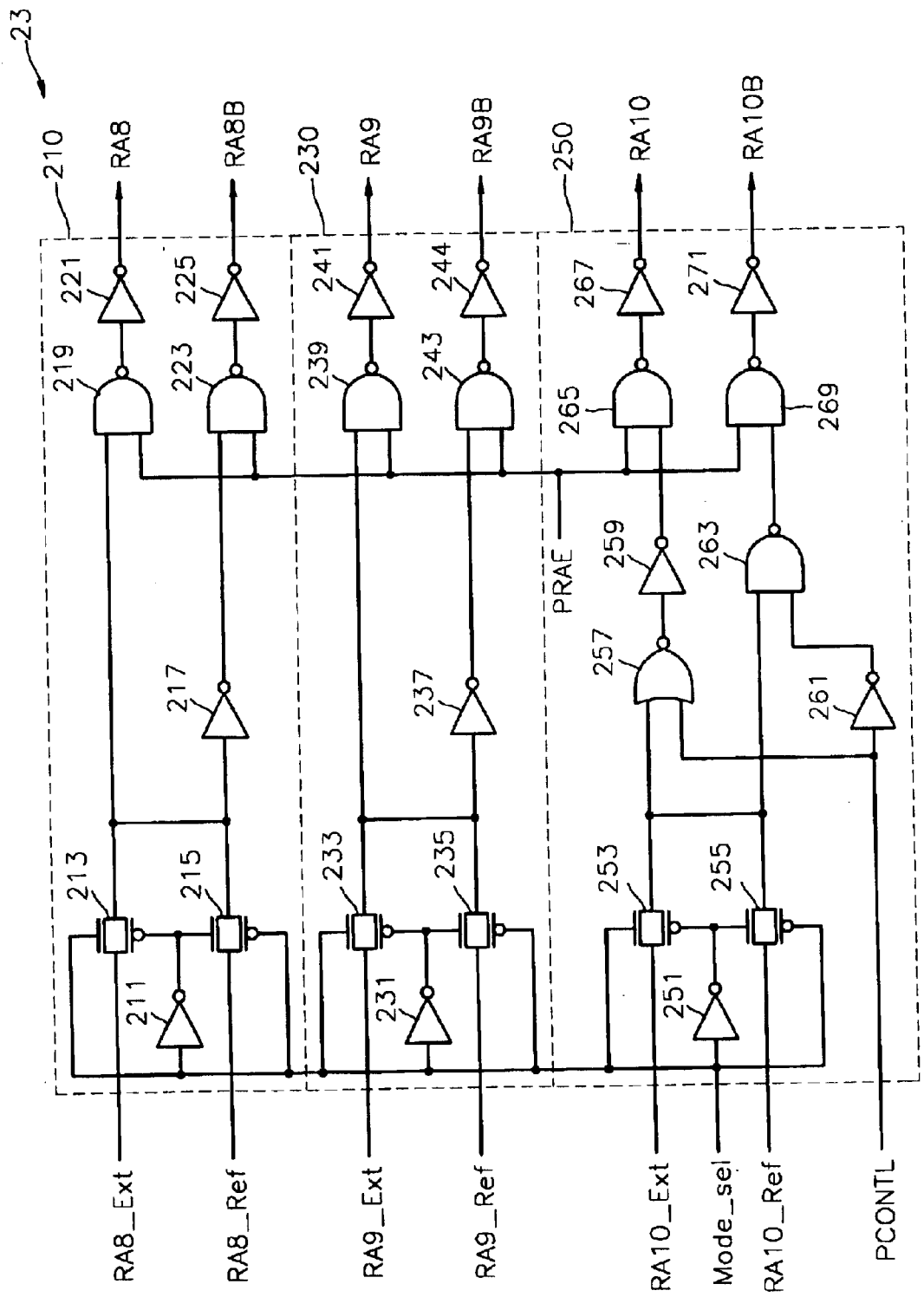
FIG. 4 is a circuit schematic of a block address buffer in accordance with some embodiments of the present invention.

FIG. 4 is a circuit schematic of the block address buffer 23, in accordance with some embodiments of the present invention. The block address buffer 23 comprises a first buffer 210, a second buffer 230, and a third buffer 250. The first buffer 210 buffers a least significant bit (LSB) RA8_Ext of an external address RA<8:10>_Ext in a normal mode or buffers the LSB RA8_Ref of a refresh address RA<8:10>_Ref in a refresh mode and outputs buffered signals RA8 and RA8B. The buffered signals RA8 and RA8B are complementary.

As shown in FIG. 4, the first buffer 210 comprises a plurality of logic gates 211, 217, 219, 221, 223, and 225 and a plurality of transmission gates 213 and 215. The first buffer 210 buffers the external address signal RA8_Ext in response to a row address enable signal PRAE being enabled (e.g., "high") in the normal mode and outputs the buffered signals RA8 and RA8B to the block decoder 19 shown in FIG. 1. Also the first buffer 210 buffers the refresh address signal RA8_Ref in response to the row address enable signal PRAE being enabled in the refresh mode and outputs the buffered signals RA8 and RA8B. States of the buffered signals RA8 and RA8B are determined by the external address RA8_Ext or the refresh address RA8_Ref.

The second buffer 230 comprises a plurality of logic gates 231, 237, 239, 241, 243, and 244 and a plurality of transmission gates 233 and 235. The second buffer 230 buffers an external address signal RA9_Ext in the normal mode or buffers the refresh address signal RA9_Ref in the refresh mode and outputs buffered signals RA9 and RA9B to the block decoder 19 shown in FIG. 1. The buffered signals RA9 and RA9B are complementary.

The third buffer 250 comprises a plurality of logic gates 251, 257, 259, 261, 265, 267, 269, and 271 and a plurality of transmission gates 253 and 255. The transmission gate 253 transmits the external address signal RA10_Ext to a NOR gates 257 and a NAND gate 263 in response to a mode select signal Mode_sel. The mode select signal Mode_sel is used to select a refresh mode or a normal mode of operation. The refresh mode is an operation mode in which a refresh operation for a plurality of memory cells of a DRAM core is performed. The normal mode is an operation mode in which data is written to or read from a plurality of memory cells of the DRAM core. The third buffer 250 buffers a most significant bit (MSB) RA10_Ext of the external address RA<8:10>_Ext in the normal mode or buffers the MSB RA10_Ref of the refresh address RA<8:10>_Ref in the refresh mode and outputs buffered signals RA10 and RA10B to the block decoder 19 shown in FIG. 1. In the normal mode, the buffered signals RA10 and RA10B are complementary, whereas in the refresh mode, in accordance with some embodiments of the present invention, the buffered signals RA10 and RA10B may both be enabled (e.g., driven "high") in some scenarios as will be described hereafter.

Referring to FIG. 4, the transmission gate 253 outputs the external address signal RA10_Ext to both the NOR gate 257 and the NAND gate 263 in response to the mode select signal Mode_sel being enabled (e.g., "high"). The transmission gate 255 outputs the refresh address signal RA10_Ref to the NOR gate 257 and the NAND gate 263 in response to the mode select signal Mode_sel being disabled (e.g., "low").

The refresh period control signal PCONTL is input to the NOR gate 257 and is also input to the NAND gate 263 via an inverter 261. An output signal of the NOR gate 257 is input to the NAND gate 265 via an inverter 259. An output signal of the NAND gate 263 is input to the NAND gate 269 and the row address enable signal PRAE is input to the NAND gates 265 and 269, respectively. When the row address enable signal PRAE is enabled, the block address buffer 23 is enabled.

The NAND gate 265 performs a NAND operation of the output signal of the inverter 259 and the row address enable signal PRAE and outputs the buffered signal RA10 via an inverter 267. Also, the NAND gate 269 performs a NAND operation of the output signal of the NAND gate 263 and the row address enable signal PRAE and outputs the buffered signal RA10B via an inverter 271.

FIG. 5 is a timing diagram that illustrates refresh operations in accordance with some embodiments of the present invention. For purposes of illustration, in the discussion that follows, the signals RA8_Ext, RA9_Ext, RA8_Ref, and RA9_Ref are "low" and the buffered signals RA8B and RA9B are enabled regardless of whether the operation mode is normal or refresh. Accordingly, the blocks (e.g., block #0 (3) and block #4 (11)) selected by the external address signals RA<8:10>_Ext or the refresh address signals RA<8:10>_Ref are determined by the buffered signals RA10 and RA10B. That is, when RA10B is enabled, then the block #0 (3) is selected, and when the RA10 is enabled, then the block #4 (11) is selected.

Methods for controlling the refresh period for the first memory cell 2 shown in FIG. 1, in accordance with some embodiments of the present invention, will now be described with reference to FIGS. 1–5. Referring to FIGS. 2 and 5, the refresh command signal PREF is disabled (i.e., "low") in the normal mode. Thus, the refresh period control signal PCONTL is "low" regardless of the output signals of the comparators 32, . . . , 34 and the output signal of the first logic circuit 35.

Referring to FIGS. 4 and 5, the mode select signal Mode_sel is enabled (i.e., "high") in the normal mode. Thus, the transmission gate 253 outputs the external address signal RA10_Ext at a logic "low" level to the NOR gate 257 and the NAND gate 263 in response to the mode select signal Mode_sel and the output signal of the inverter 251.

The NOR gate 257 generates a "high" output signal in response to the refresh period control signal PCONTL being "low" and the external address signal RA10_Ext being "low." The NAND gate 263 generates a "high" output in response to the external address signal RA10_Ext being "low" and the output signal of the inverter 261 being "high."

When the row address enable signal PRAE transitions to a "high" logic level, then the NAND gates 265 and 269 are enabled. Thus, the NAND gate 265 generates a "high" output signal in response to the output signal of the inverter 259 being "low" and the row address enable signal PRAE being "high." The inverter 267 inverts the output signal of the NAND gate 265; therefore, the output signal RA10 of the inverter 267 is "low." The NAND gate 269, however, generates a "low" output signal in response to the output signal of the NAND gate 263 and the row address enable signal PRAE being "high." The inverter 271 inverts the output signal of the NAND gate 269; therefore, the output signal RA10B of the inverter 271 is "high."

Accordingly, when RA8B, RA9B, and RA10B of the internal address signals RA<8:10> are enabled and when the address of the first memory cell 2 of the block #4 (11) is input, then the word line of the second memory cell 4 of the block #0 (3) is enabled and the second memory cell 4 of the block #0 (3) is refreshed.

An example in which the first memory cell 2 has a first refresh period of, for example, 32 ms, and the second memory cell 4 has a second refresh period of, for example, 64 ms, and the first memory cell 2 and the second memory cell 4 are simultaneously refreshed will now be described with reference to FIGS. 1 through 5.

Referring now to FIG. 5, when the refresh command signal PREF is enabled in the refresh mode, then the mode select signal Mode_sel is disabled. Referring to FIG. 2, each of the address registers 31, . . . , 33 stores the row addresses of the second memory cell 4 having the second refresh period, which also corresponds to the row addresses of the first memory cell 2 having the first refresh period.

Each of the comparators 32, . . . , 34 compares the addresses of the second memory cell 4 stored in each of the address registers 31, . . . , 33 with the input refresh addresses RA0_Ref~RA10_Ref. When the stored addresses of the second memory cell 4 are the same as the input refresh addresses RA0_Ref~RA10_Ref, then each of the comparators 32, . . . , 34 generates a "high" output signal, which signals are then provided to the first logic circuit 35. The third logic circuit 37 performs a NOR operation of the output of the first logic circuit 35, which is "high," and the output of the second logic circuit 36, which is "low," and generates a "high" output signal.

Referring to FIGS. 4 and 5, the transmission gate 255 outputs the refresh address signal RA10_Ref, which is "low," to the NOR gate 257 and the NAND gate 263 in response to the mode select signal Mode_sel and the output signal of the inverter 251. The NOR gate 257 generates a "low" output signal in response to the refresh period control signal PCONTL, which is "high," and the refresh address signal RA10_Ref, which is "low." The NAND gate 263 generates a "high" output signal in response to the refresh address signal RA10_Ref and the output signal of the inverter 261, which is "low."

When the row address enable signal PRAE transitions to "high," the NAND gates 265 and 269 are enabled. Thus, the NAND gate 265 generates a "low" output signal in response to the output signal of the inverter 259, which is "high," and the row address enable signal PRAE, which is "high." The inverter 267 inverts the output signal of the NAND gate 265; therefore, the output signal RA10 of the inverter 267 is "high."

The NAND gate 269 generates a "low" output in response to the output signal of the NAND gate 263 and the row address enable signal PRAE, which is "high." The inverter 271 inverts the output signal of the NAND gate 269; therefore, the output signal RA10B of the inverter 271 is "high."

Accordingly, RA8B, RA9B, and RA10B of the internal address signals RA<8:10> are enabled. When the address of the first memory cell 2 of the block #4 (11) is input, then the word line of the second memory cell 4 of the block #0 (3) is enabled and the word line of the first memory cell 2 of the block #4 (11) is enabled. Thus, the second memory cell 4 of the block #0 (3) and the first memory cell 2 of the block #4 (11) are simultaneously refreshed.

When the first memory cell 2 of the block #4 (11) is refreshed in a routine refresh order, then the addresses RA0_Ref~RA10_Ref of the first memory cell 2 input into the refresh period control signal generator 30 shown in FIG. 2 are not the same as the addresses of the second memory cell 4 stored in the address registers 31, . . . , 33. Thus, the refresh period control signal PCONTL is disabled.

Referring to FIG. 5, when the mode select signal Mode_sel is "low," the signal RA10_Ref is "high," and the row address enable signal PRAE is "high," then the output signal of the third buffer 250 is "high" and buffered signal RA10B is "low." Thus, only block #4 (11) and the first memory cell 2 are selected.

The memory cell array blocks 3, 5, 7, 9, 11, 13, 15, 17 of the DRAM core, according to some embodiments of the present invention, are refreshed in the order of block #0 (3) and block #4 (11), then block #1 (5), then block #2 (7), then block #3 (9), then block #4 (11), then block #5 (13), then block #6 (15), then block #7 (17), then block #0 (3) and block #4 (11), and so on. Here, when the refresh period of each of the memory cell array blocks 3, 5, 7, 9, 11, 13, 15, and 17 or the refresh period of each of the memory cells of each of the memory cell array blocks 3, 5, 7, 9, 11, 13, 15, and 17 is 64 ms, then the first memory cell 2 is refreshed again 32 ms later after being refreshed together with the second memory cell 4.

Conventionally, when the refresh period of the first memory cell 2 is 32 ms and the refresh period of the second memory cell 4 is 64 ms and the first memory cell 2 and the second memory cell 4 are refreshed every 64 ms, then data stored in the first memory cell 2 may be lost due to leakage current resulting in a failure in the memory cell 2.

Advantageously, according to embodiments of the present invention, even when the refresh period of the first memory cell 2 is 32 ms and the refresh period of the second memory cell 4 is 64 ms, the first memory cell 2 and the second memory cell 4 may be refreshed together when the second memory cell 4 is refreshed. Only the first memory cell 2 is refreshed when the first memory cell 2 is refreshed in the routine refresh order. Thus, the first memory cell 2 may operate normally and data stored therein may be saved.

Embodiments of the present invention may provide methods for refreshing memory cells having different refresh periods. In particular, a first memory cell and a second memory cell may be refreshed together when the second memory cell is refreshed and only the first memory cell is refreshed when the first memory cell is refreshed during the routine refresh order. The present invention has been described herein in the context of refresh periods of memory cells in different memory cell blocks being different. It will be understood that the present invention may also be applied to cases where memory cells in the same memory cell block have different refresh periods. For example, a memory block could be divided into halves, fourths, etc., and memory cells in different subdivisions could have different refresh periods. Moreover, it will be understood that the present invention may be applied to entire memory cell blocks. For example, a first memory cell block and a second memory cell block may be refreshed together when the second memory cell block is refreshed and only the first memory cell block is refreshed when the first memory cell block is refreshed during the routine refresh order.

Advantageously, embodiments of the present invention may provide methods and circuits for refreshing memory cells having different refresh periods, which may increase the yield of a DRAM as a single DRAM may include both types of memory cells.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

I claim:

1. A method for refreshing memory cells in a memory device, comprising:

selecting a first memory cell having a first refresh period to be refreshed; and refreshing the first memory cell and a second memory cell having a second refresh period together responsive to selecting the first memory cell to be refreshed.

2. The method of claim 1, further comprising:

selecting the second memory cell to be refreshed; and refreshing the second memory cell responsive to selecting the second memory cell to be refreshed.

3. The method of claim 1, wherein the second refresh period is shorter than the first refresh period.

4. The method of claim 1, wherein the first memory cell is in a first memory cell array block and the second memory cell is in a second memory cell array block, separate from the first memory cell array block.

5. A method for refreshing memory cells in a memory device, comprising:

selecting a first memory cell array block having a first refresh period to be refreshed; and refreshing the first memory cell array block and a second memory cell array block having a second refresh period together responsive to selecting the first memory cell array block to be refreshed.

6. The method of claim 5, further comprising:

selecting the second memory cell array block to be refreshed; and refreshing the second memory cell array block responsive to selecting the second memory cell array block to be refreshed.

7. The method of claim 5, wherein the second refresh period is shorter than the first refresh period.

8. A circuit for controlling refreshing of memory cells in a memory device, comprising:

an address register that is configured to store the address of a first memory cell having a first refresh period;

a comparison circuit that is configured to compare an input address with an output of the address register and to output a control signal indicative of a result of the comparison; and an address buffer that is configured to output addresses for refreshing the first memory cell and a second memory cell having a second refresh period together responsive to the control signal indicating a match between the input address and the address of the first memory cell.

9. The circuit of claim 8, wherein the comparison circuit is responsive to a refresh command signal.

10. The circuit of claim 8, wherein the address buffer is configured to output an address for refreshing the second memory cell responsive to the control signal indicating a non-match between an input address corresponding to the address of the second memory cell and the address of the first memory cell.

11. The circuit of claim 8, wherein the second refresh period is shorter than the first refresh period.

12. The circuit of claim 8, wherein the first memory cell is in a first memory cell array block and the second memory cell is in a second memory cell array block, separate from the first memory cell array block.

13. A circuit for controlling refreshing of memory cells in a memory device, comprising:

an address register that is configured to store the address of a first memory cell array block having a first refresh period;

a comparison circuit that is configured to compare an input address with an output of the address register and to output a control signal indicative of a result of the comparison; and an address buffer that is configured to output addresses for refreshing the first memory cell array block and a second memory cell array block having a second refresh period together responsive to the control signal indicating a match between the input address and the address of the first memory cell array block.

14. The circuit of claim 13, wherein the comparison circuit is responsive to a refresh command signal.

15. The circuit of claim 13, wherein the address buffer is configured to output an address for refreshing the second memory cell array block responsive to the control signal indicating a non-match between an input address corresponding to the address of the second memory cell array block and the address of the first memory cell array block.

16. The circuit of claim 13, wherein the second refresh period is shorter than the first refresh period.

17. A system for refreshing memory cells in a memory device, comprising:

means for selecting a first memory cell having a first refresh period to be refreshed; and means for refreshing the first memory cell and a second memory cell having a second refresh period together responsive to the means for selecting the first memory cell to be refreshed.

18. The system of claim 17, further comprising:

means for selecting the second memory cell to be refreshed; and means for refreshing the second memory cell responsive to the means for selecting the second memory cell to be refreshed.

19. The system of claim 17, wherein the second refresh period is shorter than the first refresh period.

20. The system of claim 17, wherein the first memory cell is in a first memory cell array block and the second memory cell is in a second memory cell array block, separate from the first memory cell array block.

21. A system for refreshing memory cells in a memory device, comprising:

means for selecting a first memory cell array block having a first refresh period to be refreshed; and means for refreshing the first memory cell array block and a second memory cell array block having a second refresh period together responsive to the means for selecting the first memory cell array block to be refreshed.

22. The system of claim 21, further comprising:

means for selecting the second memory cell array block to be refreshed; and means for refreshing the second memory cell array block responsive to the means for selecting the second memory cell array block to be refreshed.

23. The system of claim 21, wherein the second refresh period is shorter than the first refresh period.

* * * * *

UNITED STATES PATENT AND TRADEMARK OFFICE
CERTIFICATE OF CORRECTION

PATENT NO.    : 6,930,943 B2
DATED         : August 16, 2005
INVENTOR(S)   : Kim It is certified that error appears in the above-identified patent and that said Letters Patent is hereby corrected as shown below:

Title page,
Item [56], References Cited, U.S. PATENT DOCUMENTS, add:
-- 4,736,344            4/1998         Yanagisawa            365/222 --.
FOREIGN PATENT DOCUMENTS, add:
-- JP          06-044773          2/1994
   KR          1999-0013963       2/1999 --.
OTHER PUBLICATIONS add:
-- Notice to Submit Response issued April 29, 2004 for Korean Application No 10-2002-0012562. --.

Signed and Sealed this

Twenty-seventh Day of December, 2005

JON W. DUDAS
*Director of the United States Patent and Trademark Office*